United States Patent
Sharma et al.

(10) Patent No.: US 9,690,897 B2
(45) Date of Patent: Jun. 27, 2017

(54) EFFICIENT EXTRACTION FOR COLORLESS MULTI PATTERNING

(71) Applicant: FREESCALE SEMICONDUCTOR, INC., Austin, TX (US)

(72) Inventors: Puneet Sharma, Milpitas, CA (US); Eric Pettus, Austin, TX (US)

(73) Assignee: NXP USA, INC., Austin, TX (US)

( * ) Notice: Subject to any disclaimer, the term of this patent is extended or adjusted under 35 U.S.C. 154(b) by 134 days.

(21) Appl. No.: 14/191,981

(22) Filed: Feb. 27, 2014

(65) Prior Publication Data

US 2015/0242561 A1    Aug. 27, 2015

(51) Int. Cl.
    *G06F 17/50* (2006.01)
(52) U.S. Cl.
    CPC ...... *G06F 17/5081* (2013.01); *G06F 17/5077* (2013.01)
(58) Field of Classification Search
    USPC .......................................................... 716/55
    See application file for complete search history.

(56) References Cited

U.S. PATENT DOCUMENTS

| 7,935,965 | B1 | 5/2011 | Brozek |
| 8,119,310 | B1 | 2/2012 | Lu et al. |
| 8,252,489 | B2 | 8/2012 | Su et al. |
| 2009/0193375 | A1* | 7/2009 | Izuha ................. G06F 17/5068 716/113 |
| 2014/0123086 | A1* | 5/2014 | Buck ................... G06F 17/5081 716/102 |
| 2015/0052492 | A1* | 2/2015 | Hou ........................ G03F 1/144 716/113 |
| 2015/0205905 | A1* | 7/2015 | Ho ............................ G03F 7/70 716/52 |

OTHER PUBLICATIONS

Jae-Seok Yang and David Z. Pan, "Overlay Aware Interconnect and Timing Variation Modeling for Double Patterning Technology", International Conference on Computer-Aided Design (ICCAD'08), Nov. 10-13, 2008, 6 pages.

* cited by examiner

*Primary Examiner* — Thuan Do

(57) ABSTRACT

A method for parasitic capacitance extraction for integrated circuit (IC) designs fabricated involving multiple patterning that includes identifying, at a computing system, metal features in a metal layer of an IC design and generating, at the computing system, a graph based on spacing relationships between the metal features. The method further includes predicting, at the computing system, which metal features are to be formed by the same mask in the multiple patterning lithography process from the graph. The method further can include performing, at the computing system, a parasitic capacitance extraction analysis of the IC design utilizing the prediction of which metal features are to be formed by the same mask, and performing, at the computing system, timing analysis on the IC design utilizing the list of vertices sharing the same designators and the parasitic capacitance extraction calculations.

20 Claims, 5 Drawing Sheets

EFFICIENT EXTRACTION FOR COLORLESS MULTI PATTERNING

BACKGROUND

Field of the Disclosure

The present disclosure relates generally to parasitic capacitance extraction for integrated circuit (IC) designs and, more particularly, to parasitic capacitance extraction for IC designs to be fabricated using multiple patterning.

Description of the Related Art

Dual patterning (or more generally, multiple patterning) often is used during integrated circuit (IC) fabrication to form metal features in closer proximity than is possible in a single mask fabrication process. In a multiple patterning process, different metal features of the same metal layer are formed using different masks during a lithography process. However, misalignment issues and other issues can introduce a significant margin of error, and thus the spacing between a metal feature formed via one mask and a proximate metal feature formed via another mask may vary significantly relative to the designed or intended distance, particularly in contrast to the relatively small margin of error that may be present between metal features formed from the same mask.

This relatively large margin of error in feature spacing introduced by multiple patterning often has pernicious effects in characterizing the IC circuit design. To illustrate, a parasitic capacitance extraction process often is performed on an IC design to estimate the parasitic capacitance likely to be present between two metal features (which is inversely proportional to the spacing between the two metal features). The parasitic capacitance results in turn are used in timing analysis of the circuit, and thus are used to characterize the timing parameters of the IC design. Because of the large variability in relative spacing between two metal features on different masks, the parasitic capacitance extraction process often implements a pessimistic worst-case scenario by assuming that two metal features on separate masks have the minimum spacing reflected by the margin of error, and thus in turn results in the calculation of significantly more conservative timing parameters than may be necessary. The negative impact on timing parameter calculation under this pessimistic assumption often is further exacerbated because the IC designers are not informed as to which metal features are to be assigned to which masks by the IC fabricator, and thus the IC designers typically assume that all proximate metal features are on different masks and thus assume the pessimistic worst-case scenario for all metal feature pairs during the parasitic capacitance extraction and timing analysis processes.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-7 illustrate techniques for analyzing an IC design to predict which metal features of a metal layer of the IC design are to be fabricated using the same mask in a multiple patterning lithography process. In at least one embodiment, the IC design is analyzed and a graph representing the metal features of the metal layer is generated from this analysis. Each metal feature is represented by a vertex of the graph. Two vertices are connected by an edge in the graph when the corresponding metal features are separated by a distance less than a specified minimum distance value, which represents the minimum spacing necessary between metal features within the same mask under the applicable mask rules. As such, an edge between two vertices indicates that the two corresponding metal features must be on different masks. The resulting graph is analyzed using the techniques described herein to identify additional metal feature pairs that are expected to be formed using the same mask. This same mask information then may be used in characterization tools for the IC design to generate analysis data for the IC design, such as in parasitic capacitance extraction, whereby a less-conservative worst case, or "worse case," parasitic capacitance estimation may be implemented for those metal features predicted to be on the same mask for timing analysis, and thus permit a more accurate and less overly-conservative determination of the timing parameters of the IC design.

Reference is made herein to color mask designators, such as "red" and "blue" masks, as well as reference to odd values and even values with respect to a particular mask or graph level. These references are intended to be merely illustrative of a type of designator that can be assigned to a metal feature during analysis in order to determine which metal features are located on the same mask, and are not intended to identify a specific mask. To illustrate, metal features associated with a "blue" mask are not predicted to be on a particular mask, but rather are predicted to be all on the same mask and on a different mask than metal features associated with a mask having a different color designator (e.g., a "red" mask).

Figure 1:
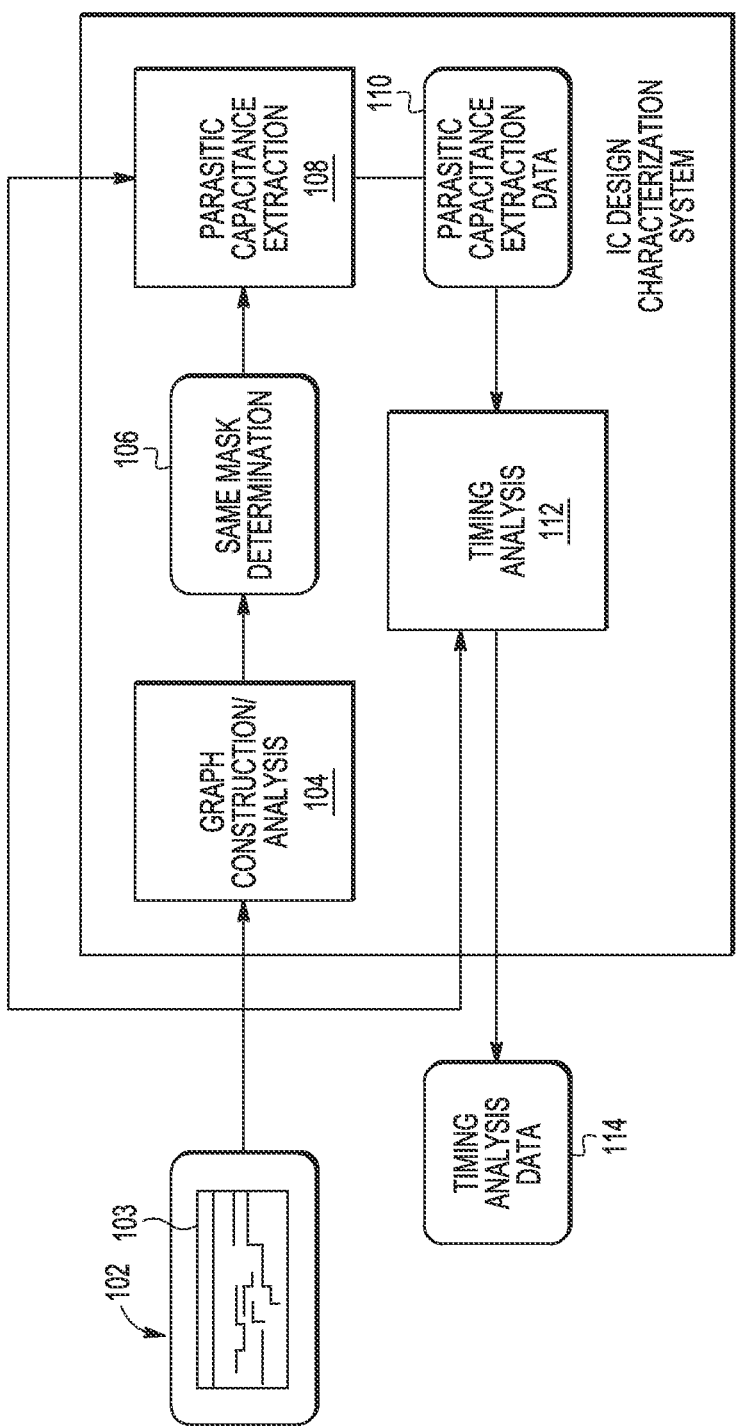
FIG. 1 is a block diagram of an IC design characterization system in accordance with at least one embodiment of the present disclosure.

FIG. 1 illustrates an IC design characterization system 100 in accordance with at least one embodiment. The IC design characterization system 100 comprises a computing system that includes a graph construction/analysis module 104, a parasitic capacitance extraction module 108, and a timing analysis module 112. The IC design characterization system 100 is implemented in a computing system, such as a desktop computer, workstation, server, or combination thereof. The individual modules of the IC design characterization system 100 described below can reflect individual or collective software programs executed by one or more processors, function-specific hardware devices, or combinations thereof. Further, although illustrated and described individually, each of the modules described below can represent a portion of a larger software program, function-specific hardware device, or combination thereof. In a software-based implementation, the functionality described herein may be implemented as a set of executable instructions stored in a non-transitory computer-readable storage medium, such as an optical or magnetic storage drive, system memory, flash memory, and the like. The set of executable instructions are accessed from the computer-readable storage medium and supplied to one or more processors, which execute the set of executable instructions such that the executable instructions manipulate the one or more processors to perform the functions described herein.

Figure 2:
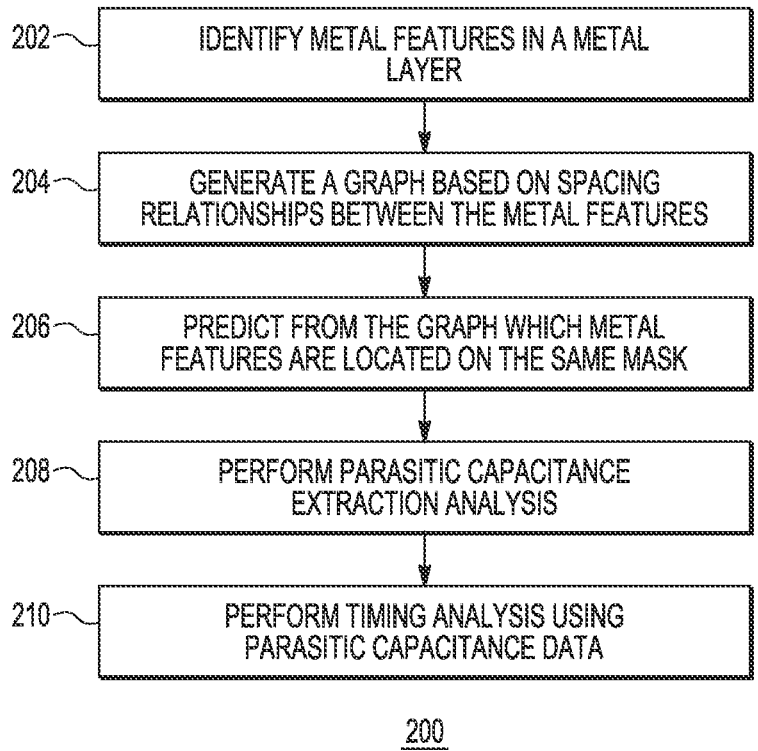
FIG. 2 is a flow diagram of an implementation of the IC design characterization system in accordance with at least one embodiment of the present disclosure.

FIG. 2 illustrates a general method 200 of operation of the IC design characterization system 100 of FIG. 1 for use in performing timing analysis of an IC design 103. The timing analysis is performed in anticipation of fabrication of an IC device based on the IC design 103 according to a multiple-patterning lithography process that uses N masks (N>=2) to form metal features at a metal layer of the IC design 103. At block 202, the graph construction/analysis module 104 receives layout data 102 for the IC design 103 created by IC designers in anticipation of fabrication of IC devices based on the IC design 103. The layout data 102 includes design information describing metal features of one or more metal layers of the IC design 103. Further at block 202, the graph construction/analysis module 104 uses the layout data 102 to identify the metal features of a selected metal layer. From this information, at block 204 the graph construction/analysis module 104 generates a graph that represents the spacing relationships between the metal features of the selected metal layer. At block 206, the graph construction/analysis module 104 analyzes the graph in order to predict which metal features will be located on the same mask (referred to herein as "predicted same-mask metal features") in accordance with the techniques described herein. The processes of blocks 202, 204 and 206 can be repeated for each metal layer of the IC design 103.

Generally, the techniques described herein may be applied so as to analyze metal layers of the IC design 103 for use in a multiple patterning lithography process that uses N masks (N>=2). However, the particular details of the analysis of a resulting graph to identify same-mask metal feature pairs may differ depending on whether the multiple patterning lithography process uses two masks (i.e., N=2) or uses more than two masks (i.e., N>=3). A particular implementation of the processes of blocks 204 and 206 for predicting same-mask metal features in a two-mask multiple patterning lithography fabrication process is described below with reference to FIGS. 3, 4, and 5, while another particular implementation of the processes of blocks 204 and 206 for predicting same-mask metal features in a multiple patterning lithography process using three or more masks (i.e., N>=3) is described below with reference to FIGS. 4, 6, and 7.

At block 208, the resulting same-mask predictions for the IC design 103 are provided as same-mask determination data 106 to the parasitic capacitance extraction module 108, whereupon parasitic capacitance extraction module 108 uses the same-mask determination data 106, along with the IC design 103, to estimate parasitic capacitance values for the metal features of the IC design 103, and then provides these parasitic capacitance values as parasitic capacitance extraction data 110 to a timing analysis module 112. The parasitic capacitance extraction module 108 can implement any of a variety of proprietary or standard parasitic capacitance extraction algorithms, such as field solver algorithms or approximation algorithms, which are implemented by, for example, the following commercial systems: ANSYS Q3D Extractor; FastCap from MIT; Star-RCXT from Synopsys; and Calibre xACT3D from Mentor Graphics. The resulting parasitic capacitance data may be represented by, for example, the Standard Parasitic Exchange Format (SPEF) promulgated by IEEE.

At block 210, the timing analysis module 112 uses the IC design 103 and the parasitic capacitance extraction data 110 for each metal layer to perform one or more timing analysis processes in accordance with any of a variety of well-known timing analysis techniques. The resulting timing analysis data 114 generated by the timing analysis module 112 is then used to characterize the timing parameters (e.g., setup time, hold time, maximum operational frequency, etc.) of the IC design 103. As described below, because certain metal feature pairings can be predicted as to be formed by the same mask, a less-pessimistic parasitic capacitance estimation may be implemented by the parasitic capacitance extraction module 108 for such metal feature pairings, and thus less-conservative timing parameters are likely to result from the timing analysis performed by the timing analysis module 112. This analysis data then may be used to tune the IC design 103, such as by adjusting clock rates or voltages based on the timing analysis represented by the timing analysis data 114.

Figure 3:
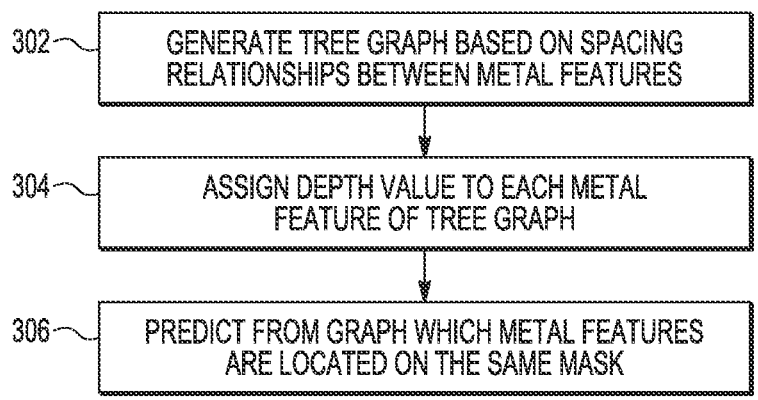
FIG. 3 is a flow diagram of a method of generating and analyzing a graph of metal features of a dual patterning design for IC circuits in accordance with at least one embodiment of the present disclosure.

FIG. 3 illustrates an example method 300 for representing the processes of blocks 204 and 206 of method 200 of FIG. 2 for generating a graph of metal features of a metal layer of the IC design 103 and predicting same-mask metal features from the graph in anticipation of the use of a two-mask multiple patterning lithography process for fabricating IC devices based on the IC design 103.

The method 300 initiates at block 302, whereby the graph construction/analysis module 104 determines the spacing relationships between metal features of a selected metal layer of the IC design 103 and generates a tree graph based on these spacing relationships. In particular, the tree graph is formed such that each metal feature is represented by a corresponding vertex of the tree graph. Fabrication rules for fabricating IC devices in accordance with the IC design 103 typically minimize the minimum spacing between metal features on the same mask, that is, the rules set by the facility that fabricates the IC device specify the minimum spacing between metal features before they must be separated onto different masks (this is referred to herein as the "minimum spacing value"). The graph construction/analysis module 104 determines the spacing between each pair of metal features in the metal layer. In the event that a selected pair of metal features has a spacing equal to or less than the minimum spacing value, the graph construction/analysis module 104 connects the corresponding vertices by an edge. Conversely, if the spacing between the pair of metal features is greater than this minimum spacing value, no edge is formed between the corresponding vertices.

The presence of an edge between two vertices in the tree graph reflects that the two metal features represented by the two vertices have a spacing less than the minimum spacing available on a single mask, and thus indicates that the two metal features must be on different masks (that is, are "different-mask metal features"). Any two metal features represented by a pair of vertices indirectly connected to each other via a single intervening vertex must be on the same mask in a two-mask lithography process. Thus, if vertex A and vertex B are connected by an edge and vertex B and vertex C are connected by an edge, then the metal features represented by vertex A and vertex C must be on the same mask as they both are on a different mask than the metal feature represented by vertex B. This relationship is manifested in the tree graph based on the levels, or depths, of the tree graph in that metal features represented by vertices at the odd-numbered levels or odd-numbered depths of the tree graph must be formed by one mask (e.g., a "blue" mask) and the metal features represented by vertices at the even-numbered levels or even-numbered depths of the tree graph must be formed by the other mask (e.g., a "red" mask). Accordingly, at block 204 the graph construction/analysis module 104 assigns each vertex a depth value based on its level or depth within the tree graph, and at block 206 the graph construction/analysis module 104 predicts each metal feature as being on either the "blue" mask or the "red" mask depending on whether the depth value assigned to the vertex representing the metal feature is an odd value ("blue" mask) or an even value ("red" mask). Thus, all metal features predicted to be formed by the "blue" mask are a set of predicted same-mask metal features, and all metal features predicted to be formed by the "red" mask are a different set of predicted same-mask metal features.

With the information identifying which metal features are predicted to be on the same mask (that is, are same-mask features), less conservative estimations of both the spacing variation between the metal features predicted to be on the "blue" mask and also between the metal features predicted to be on the "red" mask may be employed for parasitic capacitance extraction. This ability to use less conservative estimations may result in more accurate (and less pessimistic) parasitic capacitance values for use in timing analysis. In turn this may result in timing parameters for the IC design 103 that are not as overly-conservative as would otherwise be the case if the absolute worst-case spacing variation (that is, the "worst" worst case spacing variation) was assumed in the absence of knowing which metal features would be on the same mask or different mask.

Figure 4:
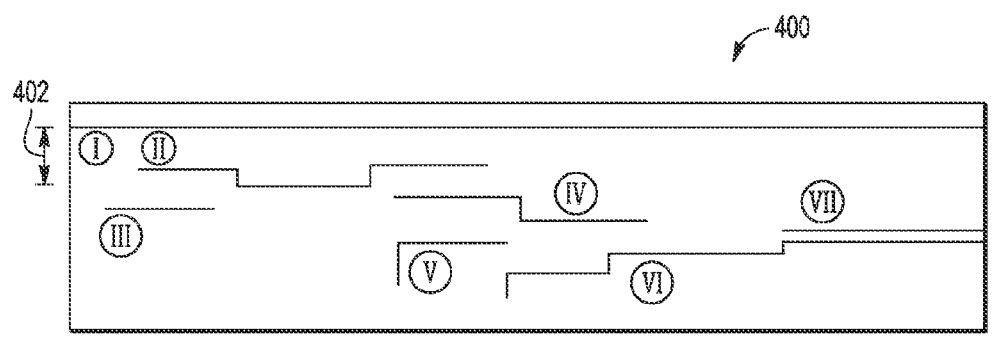
FIG. 4 is a cross-sectional view of a design pattern for metal features of a metal layer of an IC circuit in accordance with at least one embodiment of the present disclosure.
Figure 5:
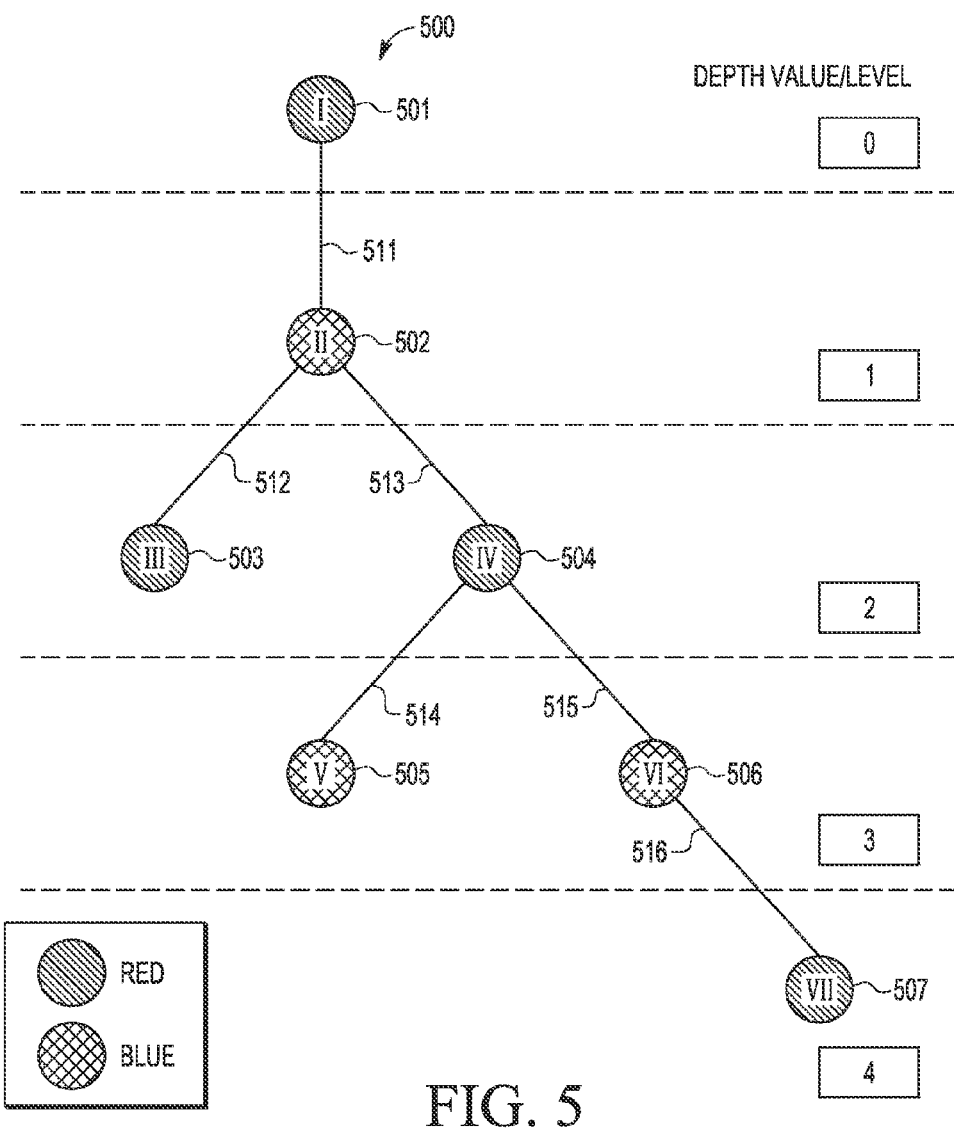
FIG. 5 is a tree graph generated based upon the design pattern of FIG. 4 for a dual patterning design for IC circuits in accordance with at least one embodiment of the present disclosure.

FIGS. 4 and 5 illustrate an example application of the method 300 for a metal layer of the IC design 103. In particular, FIG. 4 illustrates a top view of the metal features of a simplified metal layer 400 of the IC design 103 in accordance with at least one embodiment. In the depicted example, the metal layer 400 includes seven metal features, identified in FIG. 4 as metal features I, II, III, IV, V, VI, and VII (collectively, "metal features I-VII"), whereby the metal features I-VII represent a portion of the metal interconnect structure formed in an IC device upon fabrication. Also illustrated in FIG. 4 is the minimum spacing value 402 representing the minimum spacing required between metal features of the same mask in accordance with the applicable lithography process rules.

FIG. 5 illustrates a tree graph 500 constructed by the graph construction/analysis module 104 based on the spacing relationships of the metal features I-VII of the metal layer 400 in accordance with at least one embodiment. In the depicted example, the tree graph 500 is comprised of seven vertices 501, 502, 503, 504, 505, 506, and 507 (collectively, vertices 501-507), with each vertex labeled with the corresponding metal feature that it represents, such that vertex 501 represents metal feature I, vertex 502 represents metal feature II, vertex 503 represents metal feature III, vertex 504 represents metal feature IV, vertex 505 represents metal feature V, vertex 506 represents metal feature VI, and vertex 507 represents metal feature VII.

The graph construction/analysis module 104 compares the spacing between each pairing of metal features I-VII to the minimum distance value 402. If the spacing is less than the minimum distance value 402, the metal features cannot be on the same mask and thus an edge is formed between the two vertices representing the two metal features. The tree graph 500 represents the result of this analysis on the metal features I-VII of the metal layer 400. To illustrate, because the spacing between the metal feature I and the metal feature II is less than the minimum distance value 402, an edge 511 is formed between the vertex 501 and the vertex 502. In contrast, because the spacing between the metal feature I and the metal feature III is greater than the minimum distance value 402, no edge is formed between vertex 501 and vertex 503. Edges 512, 513, 514, 515, and 516 are formed in the tree graph 500 based on similar evaluations of the corresponding metal feature pairings.

In the resulting tree graph 500, the following depth assignments are made based on the resulting levels of the tree graph 500: vertex 501/metal feature I is assigned a depth value of 0; vertex 502/metal feature II is assigned a depth value of 1; vertex 503/metal feature III and vertex 504/metal feature IV each are assigned a depth value of 2; vertex 505/metal feature V and vertex 506/metal feature VI are assigned a depth value of 3; and vertex 507/metal feature VII is assigned a depth value of 4. Accordingly, as vertices 501, 503, 504, and 507 all have even-valued depth values, metal features I, III, IV, and VII are all predicted to be formed by the same mask, namely, the "red" mask, and thus are "same-mask features" relative to each other. Likewise, as vertices 502, 505, and 506 all have odd-valued depth values, metal features II, V, and VI are all predicted to be formed by the same mask, namely the "blue" mask, and thus are "same-mask features" relative to each other. As such, the less-conservative spacing variation accorded same mask metal features may be used when estimating the parasitic capacitances between the metal features I, III, IV, and VII, and when estimating the parasitic capacitances between the metal features II, V, and VI. In contrast, without being able to predict which metal features were on the same mask, a pessimistic assumption would be necessary such that the worst-case spacing variation between metal features of different masks would otherwise have to be implemented for estimating the parasitic capacitances between any of the metal features I-VII.

Figure 6:
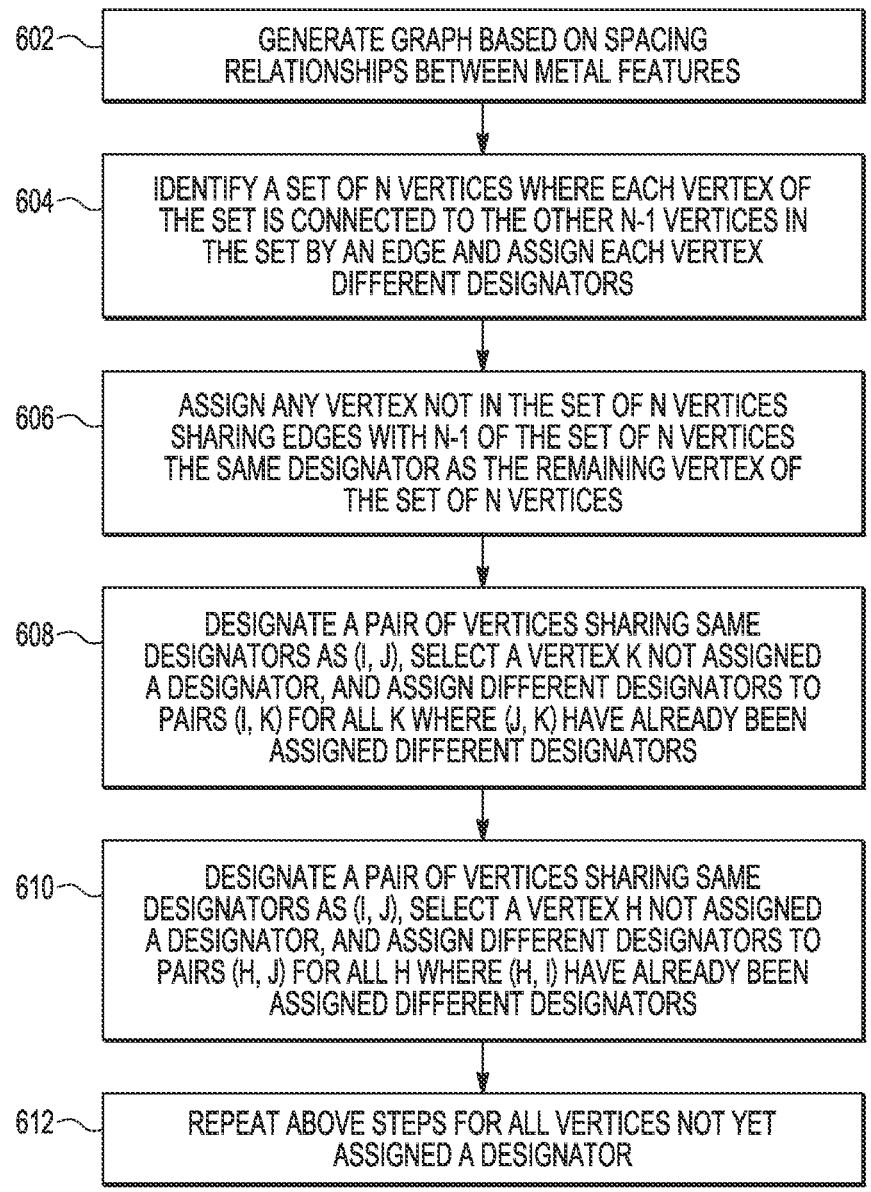
FIG. 6 is a flow diagram of a method of generating and analyzing a graph of metal features of a multiple patterning design for IC circuits in accordance with at least one embodiment of the present disclosure.

FIG. 6 illustrates an example method 600 for representing the processes of blocks 204 and 206 of method 200 of FIG. 2 for generating a graph of metal features of a metal layer of the IC design 103 and predicting same-mask metal features from the graph in anticipation of the use of a multiple patterning lithography process using three or more masks (N>=3) for each metal layer for fabricating IC devices based on the IC design 103.

The method 600 initiates at block 602, whereby the graph construction/analysis module 104 determines the spacing relationships between metal features of a selected metal layer of the IC design 103 and generates a graph based on these spacing relationships. In particular, the graph is formed such that each metal feature is represented by a corresponding vertex of the graph. In accordance with a minimum spacing value, the graph construction/analysis module 104 connects vertices having a spacing equal to or less than the minimum spacing value by an edge. Alternatively, if the spacing between the pair of metal features is greater than this minimum spacing value, no edge is formed between the corresponding vertices. The presence of an edge between two vertices in the graph reflects that the two metal features represented by the two vertices are different-mask metal features.

Once the graph has been generated based on the minimum spacing value, different pairings of vertices are analyzed in order to identify which of N masks each vertex will be located on. First, at block 604, a set of N vertices is identified, where each vertex is connected to the other N−1 vertices in the set by an edge, with N being the number of masks that are used to form the metal features of the particular metal layer. Vertices within the set of N vertices that are connected to the other N−1 vertices by an edge are determined to be different mask metal features. Next, at block 606, any vertex not in the set of N vertices but sharing edges with N−1 of the set of N vertices is assigned the same mask designator as the remaining vertex of the set of N vertices, indicating that these two vertices are same-mask features.

At block 608, a pair of vertices previously assigned same mask designators by way of the analysis performed at block 606 are designated as I and J, respectively. Next, a vertex K that has not been assigned a designator is selected. Vertex pair (I,K) is given different mask designators and deemed to be different mask metal features for all K vertices where (J,K) pairings of vertices have already been assigned different mask designators. Next, at block 610, again a pair of vertices previously assigned same mask designators are designated as I and J, respectively. A vertex H that has not been assigned a designator is then selected. Vertex pair (H,J) is given different mask designators and deemed to be different mask metal features for all H vertices where (H,I) pairings of vertices have already been assigned different mask designators. Lastly, at block 612, the analysis techniques performed at blocks 608 and 610 are repeated until all vertices have been assigned mask designators and all metal features that are same-mask features have been identified through the graph analysis.

Figure 7:
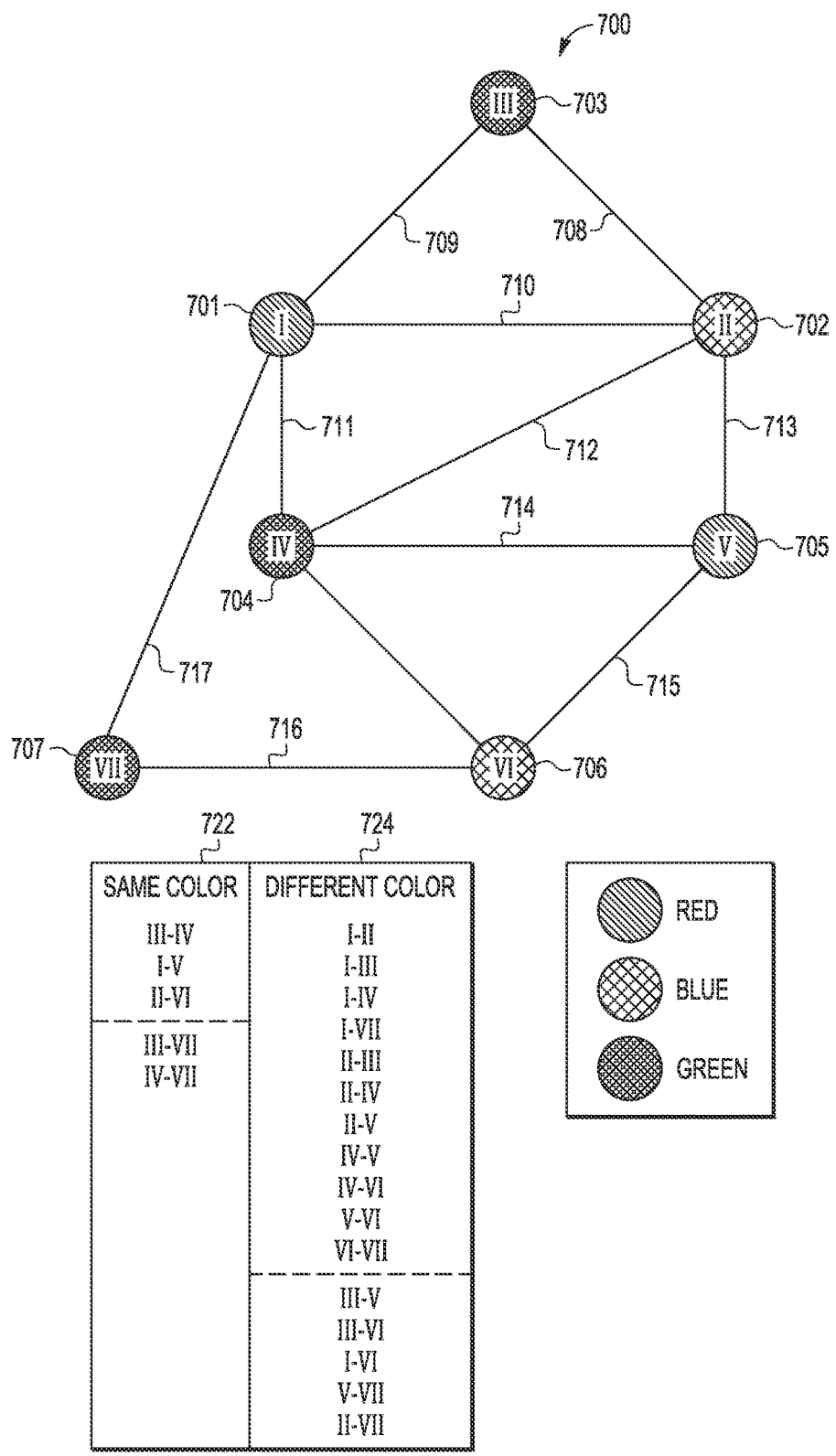
FIG. 7 is a graph generated based upon the design pattern of FIG. 4 for a multiple patterning design for IC circuits, along with a resulting list of data, in accordance with at least one embodiment of the present disclosure.

FIG. 7 illustrates a tree graph 700 constructed by the graph construction/analysis module 104 based on the spacing relationships of the metal features I-VII of the metal layer 400 in accordance with at least one embodiment. In the depicted example, the graph 700 is comprised of seven vertices 701, 702, 703, 704, 705, 706, and 707 (collectively, "vertices 701-707"), with each vertex labeled with the corresponding metal feature that it represents, such that vertex 701 represents metal feature I, vertex 702 represents metal feature II, vertex 703 represents metal feature III, vertex 704 represents metal feature IV, vertex 705 represents metal feature V, vertex 706 represents metal feature VI, and vertex 707 represents metal feature VII.

Two different lists are to be generated and maintained throughout analysis of the graph 700, one being of pairs of vertices sharing the same mask designator 722, or located on the same mask, and one being of pairs having different mask designators 724, or located on different masks. For ease of explanation, the mask designators are referred to in terms of color within the present disclosure. These color mark designators are not intended to identify particular masks, but instead to group metal features as same-mask features. For example, those features identified as being located on a "blue" mask are thus identified as predicted to be on the same mask (that is, same-mask features) but the particular mask used to implement these features is not meant to be inferred from the designator "blue" mask. For example, in this particular embodiment three masks are employed with the mask designators being represented by the colors red, blue, and green.

To begin the graph analysis, the graph construction/analysis module 104 compares the spacing between each pairing of metal features I-VII to a minimum distance value representing the minimum spacing required between metal features of the same mask in accordance with the applicable lithography process rules. If the spacing is less than the minimum distance value, the metal features cannot be on the same mask and thus an edge is formed between the two vertices representing the two metal features. The graph 700 represents the result of this analysis on the metal features I-VII of the metal layer 400. To illustrate, because the spacing between the metal feature I and the metal feature II is less than the minimum distance value, an edge 710 is formed between the vertex 701 and the vertex 702. In contrast, because the spacing between the metal feature I and the metal feature V is greater than the minimum distance value, no edge is formed between vertex 701 and vertex 705. Edges 708, 709, 711, 712, 713, 714, 715, 716, and 717 are formed in the graph 700 based on similar evaluations of the corresponding metal feature pairings. Pairs of vertices sharing an edge, and thus required to be located on different masks, are added to the list of pairs of vertices having different mask designators 724.

Next, a set of N vertices is identified, whereby each vertex is connected to the other N−1 vertices by an edge. The value N represents the number of masks that will be utilized in the multiple patterning technique employed during IC circuit fabrication and may vary based on the design parameters that are set. Once a set of N vertices has been identified, any vertex not in the set of the initial N vertices that shares edges with N−1 vertices of the set of N vertices, is assigned the same designator as the remaining vertex of the set of N vertices. For example, the first set of 3 vertices analyzed comprises vertex 701, vertex 702, and vertex 703. Since vertex 704 shares an edge with 2 (N−1) of the 3 (N) initial vertices, edge 711 shared with vertex 701 and edge 712 shared with vertex 702, vertex 704 is assigned the same mask designator as the remaining vertex, vertex 703, of the initial set. In this case, vertex 703 and vertex 704 are assigned the mask designator green. After evaluating all of the possible sets of N vertices the list of pairs of vertices sharing same designators 722 is updated.

Next, a pair of vertices located on the list of pairs of vertices sharing same designators 722 is designated as I and J respectively. A vertex not yet assigned a designator is then selected as vertex K. The vertex K is then paired with J as a pair of vertices (J,K). For all K vertices where (J,K) is already present in the list of vertices with different designators 724, the pair of vertices (I,K) is added to the list of pairs of vertices with different designators 724. For example, in this embodiment it is known that vertex 703 and vertex 704 share the same designator from the above analysis. Thus, vertex 703 and vertex 704 can be designated as I and J, respectively. Pairing vertex K with vertex 704 as (vertex 704, K) for all vertex K that is already present in the list of vertices with different designators 724, in this example being vertex pairs (vertex 704, vertex 705) and (vertex 704, vertex 706), results in vertex pairs (vertex 703, vertex 705) and (vertex 703, vertex 706) being added to the list of pairs of vertices with different color designators 724.

Lastly, a pair of vertices located on the list of pairs of vertices sharing same designators 722 is designated as I and J respectively. A vertex not yet assigned a designator is then selected as vertex H. The vertex H is then paired with I as a pair of vertices (H,I). For all H vertices where (H,I) is already present in the list of vertices with different designators 724, (H,J) is added to the list of pairs of vertices with different designators 724. For example, in this embodiment it is known that vertex 703 and vertex 704 share the same designator from the above analysis. Thus, vertex 703 and vertex 704 can be designated as I and J, respectively. Pairing vertex H with vertex 703 as (H, vertex 703) for all vertex H that is already present in the list of vertices with different designators 724, in this example being vertex pairs (vertex 701, vertex 703) and (vertex 702, vertex 703), results in vertex pairs (vertex 701, vertex 704) and (vertex 702, vertex 704) being added to the list of pairs of vertices with different color designators 724. Note, in this particular example (vertex 701, vertex 704) and (vertex 702, vertex 704) are already listed in the list of pairs of vertices with different designators 724 because of previous analysis and were merely used as an example.

The above analysis steps involving K and H are repeated until no further updates can be added to the table of pairs of vertices with same designators 722 or to the table of pairs of vertices with different designators 724. Once the table of pairs of vertices with same designators 722, or mask colors in this example, is complete, the vertices of the graph sharing same colors can be assigned to the same mask.

In the graph 700, the following mask color assignments are made based on the above analysis of the graph 700: vertex 701/metal feature I and vertex 705/metal feature V each are assigned a mask designator red; vertex 702/metal feature II and vertex 706/metal feature VI each are assigned a mask designator blue; and vertex 703/metal feature III, vertex 704/metal feature IV, and vertex 707/metal feature VII each are assigned a mask designator green. Accordingly, as vertices 701 and 705 are both assigned the mask designator red they are predicted to be formed by the same mask, namely, the "red" mask, and thus are same-mask features relative to each other. Likewise, as vertices 702 and 706 are both assigned the mask designator blue they are predicted to be formed by the same mask, namely, the "blue" mask, and thus are same-mask features relative to each other. And lastly, as vertices 703, 704, and 707 are all assigned the mask designator green they are predicted to be formed by the same mask, namely, the green mask, and thus are same-mask features relative to each other. As such, the less-conservative spacing variation accorded same mask metal features may be used when estimating the parasitic capacitances between the metal features I and V, the metal features II and VI, and the metal features III, IV, and VII. In contrast, without being able to predict which metal features were on the same mask, a pessimistic assumption would be necessary such that the worst-case spacing variation between metal features of different masks would otherwise have to be implemented for estimating the parasitic capacitances between any of the metal features I-VII.

Once the parasitic capacitance extraction calculations are performed employing the less-conservative spacing variation accorded same mask metal features, this information can be used to perform the timing analysis on the IC design. Thus, a quicker clock rate for the IC circuit can be calculated and a more efficient design can be fabricated.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A computer-implemented method comprising:
identifying, at a computing system, metal features in a metal layer of an integrated circuit design;
generating, at the computing system, a graph based on spacing relationships between the metal features;
predicting, at the computing system, which metal features are to be formed by a same mask in a multiple patterning lithography process using the graph; and
generating, at the computing system, analysis data for the integrated circuit design based on the prediction of which metal features are to be formed by the same mask.

2. The method of claim 1, further comprising:
performing, at the computing system, a parasitic capacitance extraction analysis of the integrated circuit design utilizing the prediction of which metal features are to be formed by the same mask.

3. The method of claim 2, further comprising:
performing, at the computing system, timing analysis on the integrated circuit design based on the parasitic capacitance extraction analysis, wherein the analysis data includes data from the timing analysis.

4. The method of claim 3, wherein performing the parasitic capacitance extraction analysis comprises:
assuming a first spacing variation between two metal features predicted to be formed on the same mask; and
assuming a second spacing variation between two metal features not predicted to be formed on the same mask, the second spacing variation greater than the first spacing variation.

5. The method of claim 1, wherein generating the graph comprises:
setting a minimum distance value representing a minimum distance requirement for metal features located on the same mask;
defining each metal feature as a vertex of the graph; and
for each pairing of vertices in the graph, selectively defining an edge between a selected pair of vertices responsive to a spacing between the two metal features represented by the selected pairing of vertices being less than the minimum distance value.

6. The method of claim 5, wherein:
the multiple patterning lithography process implements two masks for the metal layer;
the graph comprises a tree graph having a plurality of levels; and
predicting from the graph which metal features are to be formed by the same mask comprises:
predicting those metal features having vertices formed at even-numbered levels of the tree graph as to be formed by the same mask; and
predicting those metal features having vertices formed at odd-numbered levels of the tree graph as to be formed by the same mask.

7. The method of claim 5, wherein:
the multiple patterning lithography process implements more than two masks for the metal layer;
forming the graph comprises assigning each vertex a mask designator; and
predicting from the graph which metal features are to be formed by the same mask comprises predicting which metal features are to be formed by the same mask based at least in part on the mask designators of the vertices.

8. The method of claim 7, wherein assigning each vertex a mask designator comprises:
identifying a set of N vertices connected to a remaining N−1 vertices of the set of N vertices by an edge, N representing a number of masks used for the metal layer in the multiple patterning lithography process;
assigning pairs of vertices within the set of N vertices that are connected to the remaining N−1 vertices by an edge different designators; and
building a list of pairs of vertices with different designators to predict different mask features, wherein predicting which metal features are to be formed by the same mask comprises predicting which metal features are to be formed by the same mask based on the list.

9. The method of claim 8, further comprising:
assigning any vertex not in the set of N vertices that shares edges with N−1 of the set of N vertices the same designator as a remaining vertex of the set of N vertices; and
building a list of pairs of vertices sharing same designators to predict same mask features.

10. The method of claim 9, further comprising:
designating a pair of vertices, of the list of pairs of vertices sharing same designators, as I and J respectively;
selecting a vertex K from a plurality of vertices not assigned a mask designator;
pairing the vertex K with the vertex J as a pair of vertices (J,K); and
updating the list of pairs of vertices with different designators by adding (I,K) to the list for all K vertices where the pair of vertices (J,K) is already present in the list of vertices with different mask designators.

11. The method of claim 10, further comprising:
designating a pair of vertices, of the list of pairs of vertices sharing same designators, as I and J respectively;
selecting a vertex H from a plurality of vertices not assigned a designator;
pairing the vertex H with the vertex I as a pair of vertices (H,I); and
updating the list of pairs of vertices with different designators by adding the pair of vertices (H,J) to the list for all H vertices where the pair of vertices (H,I) is already present in the list of pairs of vertices with different mask designators.

12. The method of claim 11, further comprising;
identifying remaining vertices that have not been assigned a designator; and
assigning the remaining vertices a designator based on the updated list of vertices sharing the same designators.

13. The method of claim 12, further comprising:
identifying remaining vertices that have not been assigned a designator; and
assigning the remaining vertices a designator based on the updated list of vertices with different designators.

14. A computer-implemented method for parasitic capacitance extraction calculations for an integrated circuit design to be fabricated using a dual-pattern lithography process, the method comprising:
identifying, at a computing system, metal features in a metal layer of the integrated circuit design;
generating, at the computing system, a tree graph based on spacing relationships between the metal features;
assigning, at the computing system, a depth value to each metal feature of the tree graph;
predicting, at the computing system, which metal features are to be located on the same mask from the depth values;
performing, at the computing system, a parasitic capacitance extraction analysis on the metal layer utilizing the prediction from the depth value of which metal features are to be located on the same mask; and
generating, at the computing system, an integrated circuit design file based on the parasitic capacitance extraction analysis.

15. The method of claim 14, wherein generating the tree graph comprises:
setting a minimum distance value representing a minimum distance requirement for metal features located on the same mask;
defining each metal feature as a vertex of the tree graph; and
for each pairing of vertices in the tree graph:
defining an edge between a selected pair of vertices responsive to determining a measured distance between the two metal features represented by the selected pair of vertices is less than the minimum distance value.

16. The method of claim 14, wherein predicting which metal features are to be located on the same mask comprises:
assigning a mask designator, from two designators, to each vertex based on the depth value.

17. The method of claim 16, wherein:
vertices at an even depth value are assigned the same designator; and
vertices at an odd depth value are assigned a different designator.

18. The method of claim 17, wherein:
vertices assigned the same designator are located on the same mask; and
vertices assigned a different designator are located on different masks.

19. The method of claim 14, further comprising:
performing timing analysis on the integrated circuit design utilizing which vertices are located on the same mask and the parasitic capacitance extraction calculations.

20. An integrated circuit characterization system comprising:
a graph construction/analysis module to identify metal features in a metal layer of an integrated circuit design and to generate a graph based on spacing relationships between the metal features; and a parasitic capacitance extraction module to predict from the graph which metal features are to be formed by a same mask in a multiple patterning lithography process.

\* \* \* \* \*